United States Patent
Thakur et al.

(10) Patent No.: US 7,907,022 B2
(45) Date of Patent: Mar. 15, 2011

(54) PHASE-LOCKED LOOP AND METHOD FOR OPERATING THE SAME

(75) Inventors: Krishna Thakur, Greater Noida (IN); Deependra K Jain, Jabalpur (IN); Vinod Jain, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 78 days.

(21) Appl. No.: 12/428,490

(22) Filed: Apr. 23, 2009

(65) Prior Publication Data

US 2010/0271138 A1  Oct. 28, 2010

(51) Int. Cl.
*H03L 7/00* (2006.01)

(52) U.S. Cl. .................. 331/44; 331/16; 331/17

(58) Field of Classification Search .......... 331/44, 331/16, 17
See application file for complete search history.

(56) References Cited

U.S. PATENT DOCUMENTS

| 5,687,201 | A | * | 11/1997 | McClellan et al. ........... 375/374 |
| 7,095,287 | B2 | * | 8/2006 | Maxim et al. ................ 331/44 |
| 7,148,757 | B2 | * | 12/2006 | Chiu .............................. 331/16 |
| 7,365,581 | B2 | | 4/2008 | Shi et al. |
| 7,391,271 | B2 | | 6/2008 | Cranford, Jr. et al. |
| 2005/0174180 | A1 | * | 8/2005 | Mone .............................. 331/16 |
| 2008/0218229 | A1 | | 9/2008 | Cranford et al. |

OTHER PUBLICATIONS

J. Maneatis, Low-Jitter Process-Independent DLL and PLL based on self-biased techniques, IEEE Journal of Solid State Circuits, vol. 31, pp. 1723-1732, Nov. 1996.
Stefanos Sidiropoulos et al., Adaptive Bandwidth DLLs and PLLs using Regulated Supply CMOS Buffers, Dec. 2000.
Yu-Jen Lai et al., An Agile VCO Frequency Calibration Technique for a 10-GHz CMOS PLL, IEEE Journal of Solid State Circuits vol. 42, No. 2, Feb. 2007.

* cited by examiner

*Primary Examiner* — Joseph Chang
(74) *Attorney, Agent, or Firm* — Charles Bergere

(57) ABSTRACT

A phase-locked loop (PLL) system generates an oscillator signal based on an input reference signal. A calibration circuit generates a calibration current, and a voltage-to-current converter converts a control voltage into a first current. A current-controlled oscillator generates the oscillator signal based on the first current and the calibration current. A charge pump circuit, which is connected to a phase detector, the voltage-to-current converter, and the calibration circuit, generates a charge pump current based on the first current and the calibration current. The charge pump current is used to generate the control voltage based on an error signal.

10 Claims, 2 Drawing Sheets

PHASE-LOCKED LOOP AND METHOD FOR OPERATING THE SAME

BACKGROUND OF THE INVENTION

The present invention relates generally to a system for generating an oscillator signal and, more specifically, to a phase-locked loop (PLL) system for generating an oscillator signal.

A phase-locked loop (PLL) is a system that generates an oscillator signal having a constant phase relationship with an input reference signal. PLL systems are widely used in various applications such as radio, telecommunications, computers, and other electronic applications. A PLL system includes a voltage-controlled oscillator (VCO) for generating the oscillator signal based on a control voltage, and a phase detector for comparing the phase of the oscillator signal with that of the input reference signal and for generating an error signal based on the detected phase difference. The PLL system also includes a loop filter for filtering the error signal and generating the control voltage. Thereafter, the control voltage is provided to the VCO.

Generally, PLL systems are expected to operate over a wide range of frequencies and over a wide range of process, voltage and temperature (PVT) variations. To operate over a wide range of frequencies, a common practice is to increase the VCO gain. However, the increase in VCO gain makes the VCO more susceptible to phase noise. Further, lack of immunity to phase noise results in high output jitter.

In one approach used for reducing VCO gain, the loop bandwidth of the PLL system is reduced. The loop bandwidth refers to the range of frequencies over which the VCO can operate. However, reduced loop bandwidth limits the operating range of the PLL system. Further, to reduce jitter, the loop bandwidth should be set as high as possible. Hence, reducing the loop bandwidth results in having a narrow operating frequency range and poor jitter performance.

In certain PLL systems, input reference signal frequency may be tracked using a charge pump circuit. The charge pump circuit generates a charge pump current based on the error signal generated by the phase detector. However, this approach does not reduce the gain of the VCO. Further, to control variations in VCO gain, additional components must be included, which increases the size of the PLL system.

To minimize the gain of the VCO over a wide operating range, external calibration circuits are used for calibrating the VCO. During calibration, the calibration circuit coarse tunes the VCO close to a locking frequency, while keeping the PLL system in an open loop. Thereafter, the VCO is fine tuned to the locking frequency by closing the loop. The gain of the VCO is minimized as the VCO is primarily tuned by the calibration circuit. However, the calibration of the VCO does not help in reducing variations in VCO gain with respect to PVT variations. The gain variations result in variable phase margin and bandwidth, thereby leading to unstable operation of the PLL system. Further, VCO gain variations reduce the flexibility of circuit design.

It would be advantageous to have a PLL system that has low VCO gain over a wide operating range and low VCO gain variations with respect to PVT variations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
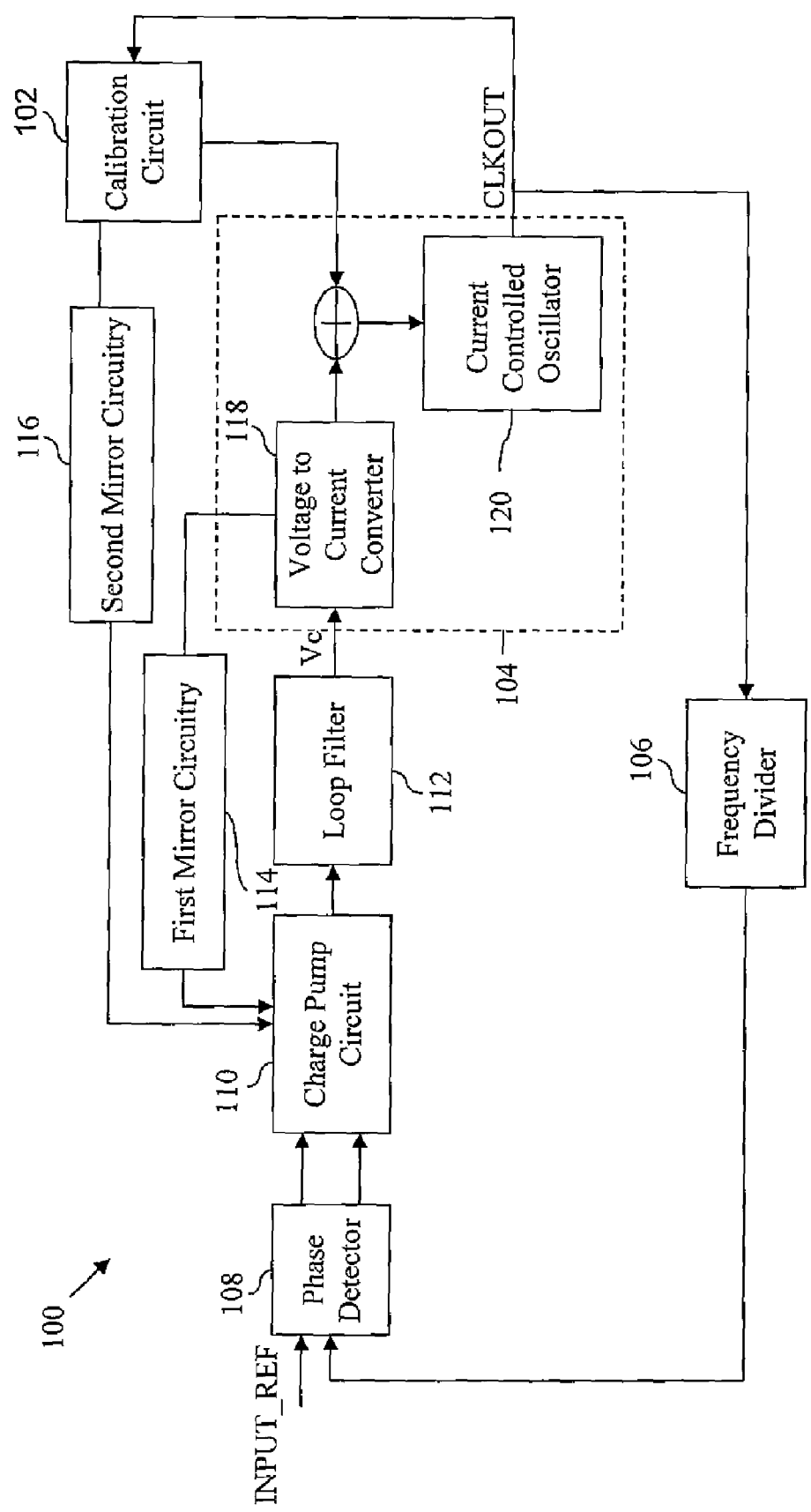
FIG. 1 is a schematic block diagram illustrating a phase-locked loop (PLL) system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) system is provided that includes a calibration circuit for generating a calibration current. The PLL system also includes a voltage controlled oscillator (VCO), which includes a voltage-to-current converter and a current-controlled oscillator. The voltage-to-current converter converts a control voltage into a first current. The current-controlled oscillator is connected to the voltage-to-current converter and the calibration circuit, and generates an oscillator signal based on the first current and the calibration current. A phase detector is coupled to the VCO for generating an error signal based on an input reference signal and at least one fraction of the oscillator signal. A charge pump circuit is connected to the phase detector, the voltage-to-current converter, and the calibration circuit. The charge pump circuit receives the error signal and generates a charge pump current by summing a first fraction of the first current and a second fraction of the calibration current. Thereafter, the charge pump current is used to generate the control voltage based on the error signal.

In another embodiment of the present invention, a system for generating an oscillator signal based on an input reference signal is provided. The system for generating the oscillator signal includes a calibration circuit for generating a calibration current. The system also includes a voltage-to-current converter and a current-controlled oscillator. The voltage-to-current converter converts a control voltage into a first current. The current-controlled oscillator is connected to the voltage-to-current converter and the calibration circuit, and generates the oscillator signal based on the first current and the calibration current. A phase detector is connected to the current-controlled oscillator. The phase detector generates an error signal based on an input reference signal and at least one fraction of the oscillator signal. A charge pump circuit is connected to the phase detector, the voltage-to-current converter, and the calibration circuit. The charge pump circuit receives the error signal and generates a charge pump current by summing a first fraction of the first current and a second fraction of the calibration current. Thereafter, the charge pump current is used to generate the control voltage based on the error signal.

In yet another embodiment of the present invention, a method for generating an oscillator signal based on an input reference signal is provided. The method for generating the oscillator signal includes generating a calibration current with a calibration circuit. A control voltage is converted into a first current with a voltage-to-current converter. The oscillator signal is generated based on the first current and the calibration current. The oscillator signal is compared with the input reference signal for generating an error signal. A charge pump current is generated based on a first fraction of the first current and a second fraction of the calibration current. The control voltage is generated from the charge pump current based on the error signal.

Embodiments of the present invention provide a phase-locked loop (PLL) system and method for generating an oscillator signal. The charge pump current is generated by summing the first fraction of the first current and the second fraction of the calibration current, thereby compensating for the variations in the VCO gain. The reduced variation in VCO gain helps in maintaining a constant phase margin and a constant bandwidth. Further, adaptive bandwidth and large operating range are achieved. The calibration of the VCO helps minimize the gain of the VCO over a wide frequency range. The reduced VCO gain also results in achieving low noise sensitivity, thereby reducing jitter.

Referring now to FIG. 1, a schematic block diagram of a phase-locked loop (PLL) system 100 in accordance with an embodiment of the present invention is shown. The PLL system 100 includes a calibration circuit 102, a voltage-controlled oscillator (VCO) 104, a frequency divider 106, a phase detector 108, a charge pump circuit 110, a loop filter 112, a first mirror circuit 114, and a second mirror circuit 116.

The calibration circuit 102 is connected to the VCO 104 and the second mirror circuit 116, and generates a calibration current. The VCO 104 includes a voltage-to-current converter 118 and a current-controlled oscillator 120. The voltage-to-current converter 118 converts a control voltage to a first current; and the current-controlled oscillator 120, which is connected to the voltage-to-current converter 118 and the calibration circuit 102, generates an oscillator signal based on the first current and the calibration current. The phase detector 108 is coupled to the VCO 104 and generates an error signal based on an input reference signal (INPUT_REF) and at least one fraction of the oscillator signal. The charge pump circuit 110 is connected to the phase detector 108, the voltage-to-current converter 118 and the calibration circuit 102, and receives the error signal from the phase detector 108. The charge pump circuit 110 generates a charge pump current by summing a first fraction of the first current and a second fraction of the calibration current, wherein the charge pump current is used to generate the control voltage based on the error signal.

The loop filter 112 is connected between the charge pump circuit 110 and the voltage-to-current converter 118 of the VCO 104. The loop filter 112 generates the control voltage (Vc) based on the charge pump current. In one embodiment of the invention, the loop filter 112 is a low pass filter.

The first mirror circuit 114 is connected between the voltage-to-current converter 118 and the charge pump circuit 110 and generates the first fraction of the first current. The second mirror circuit 116, which is connected between the calibration circuit 102 and the charge pump circuit 110, generates the second fraction of the calibration current. The frequency divider 106 is connected between the current-controlled oscillator 120 and the phase detector 108 and provides at least one fraction of the oscillator signal to the phase detector 108.

Initially, the PLL system 100 is kept in open loop and a reference voltage source (not shown) is used to generate a control voltage. The voltage-to-current converter 118 generates the first current based on the control voltage (Vc). The calibration circuit 102 generates the calibration current. The calibration current is used for coarse tuning the current-controlled oscillator 120 close to a locking frequency. The locking frequency represents the frequency of the oscillator signal to be generated. In various embodiments of the present invention, the calibration circuit 102 may comprise either analog or digital circuitry, or a combination thereof. The calibration circuit 102 may be controlled using a suitable external programmable logic circuit. The first current and the calibration current are summed and provided to the current-controlled oscillator 120. The current-controlled oscillator 120 generates the oscillator signal based on the sum of the first current and the calibration current.

In various embodiments of the present invention, the calibration circuit 102 receives the oscillator signal from the current-controlled oscillator 120 and generates the calibration current based on the received oscillator signal. The calibration circuit 102 provides the calibration current to the current-controlled oscillator 120, until it is coarse tuned close to the locking frequency.

Thereafter, the PLL system 100 is closed and the current-controlled oscillator 120 is fine tuned to the locking frequency. In the closed loop, the frequency divider 106 divides the oscillator signal by a loop division factor 'N' and provides at least one fraction of the oscillator signal to the phase detector 108. The phase detector 108 receives the input reference signal (INPUT_REF). In an embodiment of the present invention, the frequency of the input reference signal may be '1/N' times the locking frequency. Thereafter, the phase detector 108 compares the phase and frequency of the at least one fraction of the oscillator signal and the input reference signal to generate the error signal. In an embodiment of the present invention, the error signal may be in the form of a pulse having up and down transitions that represent the phase/frequency error between the input reference signal and the at least one fraction of the oscillator signal. Thereafter, the error signal is provided to the charge pump circuit 110.

The charge pump circuit 110 is configured to generate a charge pump current by summing a first fraction of the first current and a second fraction of the calibration current. The first fraction of the first current is generated by the first mirror circuit 114. Similarly, the second mirror circuit 116 generates the second fraction of the calibration current, and accordingly, provides it to the charge pump circuit 110. In various embodiments of the present invention, the first mirror circuit 114 and the second mirror circuit 116 may be current mirror circuits.

The charge pump circuit 110 is connected to the loop filter 112. The loop filter 112 receives the charge pump current and generates an equivalent control voltage. In an embodiment of the present invention, the charge pump circuit 110 is responsive to the up and down transitions of the error signal. Based on these transitions, the charge pump circuit 110 provides the charge pump current to the loop filter 112. Thereafter, the loop filter 112 converts the charge pump current into the control voltage (Vc). The control voltage is then provided to the voltage-to-current converter 118.

In various embodiments of the present invention, the charge pump circuit 110 generates the charge pump current, $I_{CP}$, by summing the first fraction of the first current and the second fraction of the calibration current. The charge pump current, $I_{CP}$, may be represented by:

$$I_{CP} = \alpha I_{V\_I} + \beta I_{CAL} \quad (1)$$

Where, $I_{V\_I}$ represents the first current generated by the voltage-to-current converter 118 and $I_{CAL}$ represents the calibration current generated by the calibration circuit 102. The values corresponding to $\alpha$ and $\beta$ may be determined based on experimental simulations. Further, the values of $\alpha$ and $\beta$ may be determined based on at least one of the operating conditions of the PLL system 100; design parameters of the PLL system 100; and desired phase margin of the PLL system 100. In this case, the values of α and β may be decided while designing the PLL system 100. In an embodiment of the invention, the values of α and β may also be determined in real time situations such as process, voltage, and temperature (PVT) variations; stability of the PLL system 100; and so forth. Based on the values of α and β, the first mirror circuit 114 and the second mirror circuit 116 generate the first fraction of the first current and the second fraction of the calibration current respectively. Furthermore, the current received by the current-controlled oscillator 120 may be represented by:

$$I_{CCO} = I_{V\_I} + I_{CAL} \quad (2)$$

From equations 1 and 2, $I_{CP}$ may be varied based on the current received by the current-controlled oscillator 120, i.e., $I_{CCO}$. Such a variable $I_{CP}$ results in an adaptive bandwidth, which reduces the output jitter. Further, the gain of the current-controlled oscillator 120 is given by:

$$K_{CCO} = \text{Frequency of the oscillator signal (Hz)}/I_{CCO} \text{ (Amp)}.$$

Any change in $K_{CCO}$ results in a change in the calibration current. Any variation in the gain of the current-controlled oscillator 120 may be compensated for by making the charge pump current dependent on the calibration current. Further, the gain of the voltage-to-current converter 118 is given by:

$$K_{V\_I} = I_{V\_I} \text{(Amp)/Control Voltage (V)}$$

However, the gain of the voltage-to-current converter 118 may change due to the PVT variations. Thus, any change in $K_{V\_I}$ results in a change in the first current. Therefore, any variation in the gain of the voltage-to-current converter 118 may be compensated for by making the charge pump current dependent on the first current and by generating the control voltage based on the charge pump current.

The bandwidth of the PLL system 100 is given by:

$$\text{Bandwidth } \alpha I_{CP} * K_{V\_I} * K_{CCO} * R/N$$

Where, $K_{V\_I}$ is the gain of the voltage-to-current converter 118, $K_{CCO}$ is the gain of the current-controlled oscillator 120, and N is the loop division factor of the frequency divider 106. By compensating for the gain of the voltage-to-current converter 118 and the current-controlled oscillator 120 through the charge pump current, an adaptive bandwidth is achieved.

Figure 2:
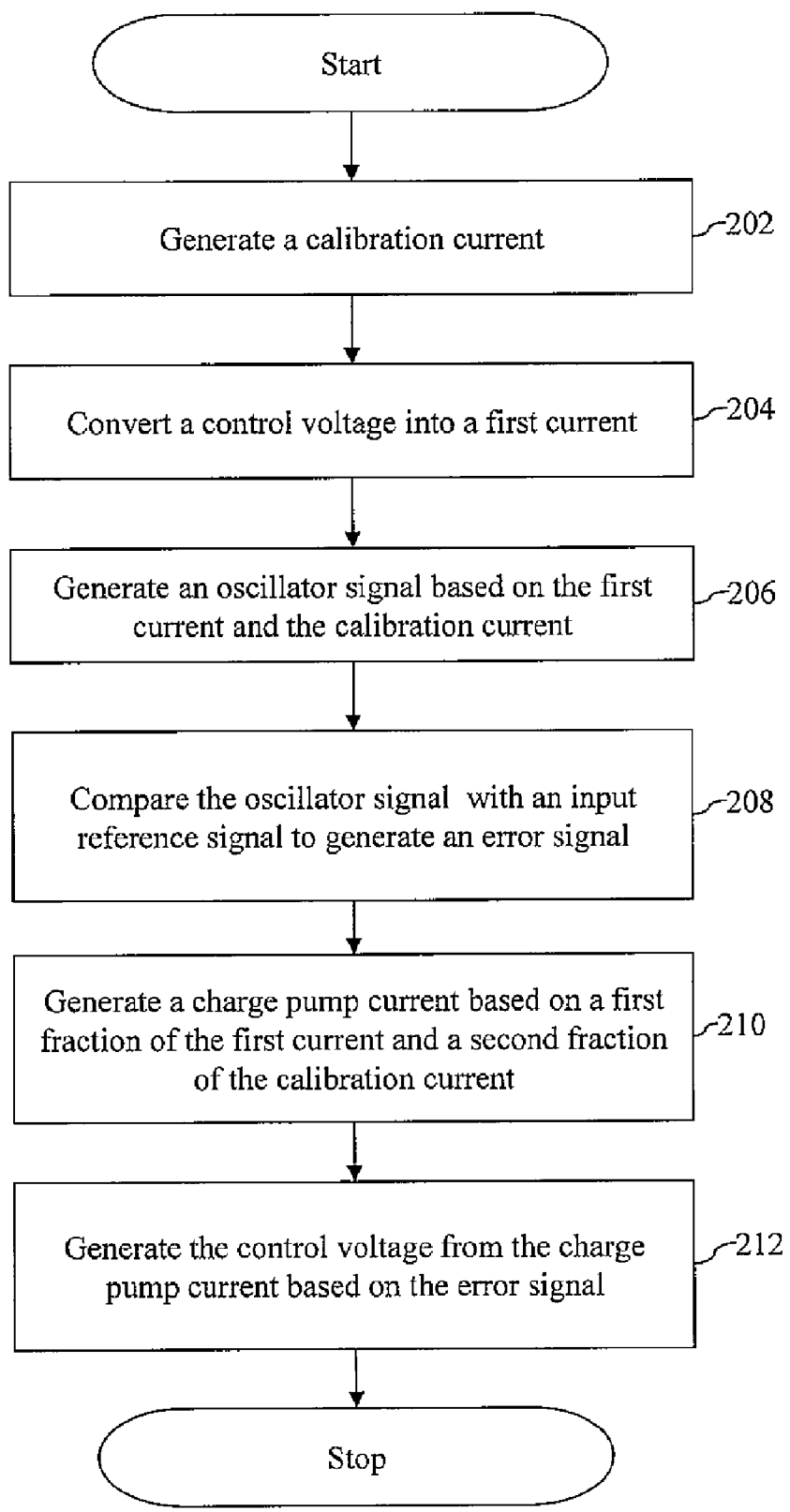
FIG. 2 is a flowchart illustrating a method for generating an oscillator signal in accordance with an embodiment of the present invention.

Referring now to FIG. 2, a flowchart illustrating a method for generating an oscillator signal based on an input reference signal is shown, in accordance with an embodiment of the present invention.

At step 202, a calibration current is generated with a calibration circuit such as the calibration circuit 102. In an exemplary embodiment of the present invention, the calibration circuit may be designed using a combination of digital and analog circuits.

At step 204, a control voltage is converted into a first current with a voltage-to-current converter, such as the voltage-to-current converter 118. Thereafter, at step 206, the oscillator signal is generated based on the calibration current generated at step 202 and the first current generated at step 204.

At step 208, the oscillator signal is compared with the input reference signal for generating an error signal. In another embodiment of the present invention, the error signal may be in the form of a pulse having up and down transitions that represent a phase error between the input reference signal and the oscillator signal.

At step 210, a charge pump current is generated based on a first fraction of the first current and a second fraction of the calibration current. In an embodiment of the present invention, the values corresponding to the first fraction of the first current and the second fraction of the calibration current is determined based on one or more conditions, such as operating conditions of the PLL system and design parameters of the PLL system.

Thereafter, at step 212, the control voltage is generated from the charge pump current based on the error signal. In an embodiment of the present invention, the charge pump current may be generated from a charge pump circuit, such as the charge pump circuit 110, which may be responsive to the up and down transitions of the error signal. Hence, the charge pump current generates the control voltage based on the phase error between the oscillator signal and the input reference signal. Thereafter, the control voltage is provided to the voltage-to-current converter.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A phase-locked loop (PLL) system, comprising:
   a calibration circuit for generating a calibration current;
   a voltage-controlled oscillator (VCO), comprising:
      a voltage-to-current converter for converting a control voltage to a first current; and
      a current-controlled oscillator connected to the voltage-to-current converter and the calibration circuit, wherein the current-controlled oscillator generates an oscillator signal based on a sum of the first current and the calibration current;
   a phase detector, coupled to the VCO, for generating an error signal based on an input reference signal and at least one fraction of the oscillator signal; and
   a charge pump circuit, connected to the phase detector, the voltage-to-current converter and the calibration circuit, for receiving the error signal, wherein the charge pump circuit generates a charge pump current by summing a first fraction of the first current and a second fraction of the calibration current, wherein the charge pump current is used to generate the control voltage based on the error signal.

2. The PLL system of claim 1, further comprising a loop filter connected between the charge pump circuit and the voltage-to-current converter, wherein the loop filter generates the control voltage based on the charge pump current.

3. The PLL system of claim 2, wherein the loop filter is a low pass filter.

4. The PLL system of claim 1, further comprising a first mirror circuit, connected between the voltage-to-current converter and the charge pump circuit, for generating the first fraction of the first current.

5. The PLL system of claim 1, further comprising a second mirror circuit, connected between the calibration circuit and the charge pump circuit, for generating the second fraction of the calibration current.

6. The PLL system of claim 1, further comprising a frequency divider connected between the current-controlled oscillator and the phase detector for providing the at least one fraction of the oscillator signal to the phase detector.

7. A system for generating an oscillator signal based on an input reference signal, comprising:
   a calibration circuit for generating a calibration current;

a voltage-to-current converter for converting a control voltage to a first current;

a current-controlled oscillator connected to the voltage-to-current converter and the calibration circuit, wherein the current-controlled oscillator generates an oscillator signal based on a sum of the first current and the calibration current;

a phase detector, connected to the current-controlled oscillator, for generating an error signal based on the input reference signal and at least one fraction of the oscillator signal;

a charge pump circuit, connected to the phase detector, the voltage-to-current converter and the calibration circuit, for receiving the error signal, wherein the charge pump circuit generates a charge pump current by summing a first fraction of the first current and a second fraction of the calibration current, wherein the charge pump current is used to generate the control voltage based on the error signal;

a first mirror circuit, connected between the voltage-to-current converter and the charge pump circuit, for generating the first fraction of the first current; and a second mirror circuit, connected between the calibration circuit and the charge pump circuit, for generating the second fraction of the calibration current.

8. The system for generating an oscillator signal of claim 7, further comprising a loop filter connected between the charge pump circuit and the voltage-to-current converter, wherein the loop filter generates the control voltage based on the charge pump current.

9. The system for generating an oscillator signal of claim 8, wherein the loop filter is a low pass filter.

10. The system for generating an oscillator signal of claim 7, further comprising a frequency divider connected between the current-controlled oscillator and the phase detector for providing the at least one fraction of the oscillator signal to the phase detector.

* * * * *